United States Patent [19]

Snow et al.

[11] Patent Number: 4,739,286

[45] Date of Patent: Apr. 19, 1988

[54] SUPPRESSION OF RADIATED HARMONICS

[75] Inventors: Philip B. Snow, Hillsboro; Emmanuel Sang, Portland, both of Oreg.

[73] Assignee: Tektronix, Inc., Beaverton, Oreg.

[21] Appl. No.: 922,488

[22] Filed: Oct. 23, 1986

[51] Int. Cl.$^4$ .............................................. H03H 9/00
[52] U.S. Cl. .................................. 331/117 R; 333/194
[58] Field of Search ............. 331/117 R, 117 FE, 167; 455/109, 114; 375/60, 61; 333/194, 193

[56] References Cited

U.S. PATENT DOCUMENTS 3,868,595  2/1975  Capps, Jr. et al. ......... 331/117 R X
4,553,110 11/1985  Kleinberg ................. 331/117 FE X Primary Examiner—Eugene R. LaRoche
Assistant Examiner—Robert J. Pascal
Attorney, Agent, or Firm—Francis I. Gray

[57] ABSTRACT

Suppression of radiated harmonics in a single stage transistor oscillator and transmitter circuit is achieved by inserting a narrow band filter, such as a surface acoustic wave resonator (SAWR), in the oscillator signal feedback loop at the point of emissions of the harmonics.

6 Claims, 1 Drawing Sheet

SUPPRESSION OF RADIATED HARMONICS

BACKGROUND OF THE INVENTION

The present invention relates to oscillator and transmitter circuits, and more particularly to the suppression of radiated harmonics from such oscillator and transmitter circuits by use of a narrow band filter in the feedback path at the effective antenna.

All oscillators and transmitters radiate energy on a fundamental, or center, frequency as well as at harmonic frequencies. For applications requiring high orders of stability piezoelectric crystals have been used as the oscillating element in lieu of LC tank circuits. However for most applications LC tank circuits are adequate. One application for oscillators and transmitters is in security alarm devices and garage door radio controls. These devices are designed for minimum cost and typically use a single transistor stage that relies on an exposed (unshielded) construction on a printed circuit board to radiate a coded signal. Since there has been no definable antenna or "point of emission" established by this open design technique, it has been difficult for the manufacturer of these devices to filter harmonic levels.

A typical oscillator and transmitter, such as the Model 50 Remote Control Oscillator manufactured by Chamberlain Manufacturing Corporation of Elmhurst, Ill., is shown in FIG. 1. This device oscillates because the gain of the transistor stage is sufficient at the desired frequency, such as 390 MHz, to allow positive feedback between the base and emitter. The collector is parallel tuned to the desired frequency to produce a high impedance and the emitter is series tuned to the desired frequency to provide a low impedance. The ratio of collector to emitter impedance sets the gain. The feedback loop goes from the base through a bypass capacitor C4 to signal ground, or negative battery return, through the emitter capacitor C3 that series resonates with the emitter inductance at the desired frequency. If either the bypass or emitter capacitors, C4 or C3, are removed, the feedback loop is opened and the transistor stage is stable and does not oscillate. If the value of the emitter capacitor C3 is altered sufficiently or the collector LC circuit, L, C1 and C2, is detuned, the frequency changes, the gain drops and the oscillator operates at a lower power level or quits oscillating. Thus, the typical transistor stage oscillator and transmitter is solely dependent on the active device, the biasing, and the values of the LC components in the circuit for operational performance, i.e., power level, frequency stability and frequency settability.

As shown in FIG. 2 the resulting output from this type of oscillator and transmitter radiates energy not only at the desired frequency, but also radiates significant energy at the harmonics of the desired frequency. In 1982 the Federal Communications Commission (FCC) adopted amendments to the rules in Part 15, Subpart E, which imposed limits of 125 microvolts per meter on the harmonic emissions over one thousand MHz for such oscillator and transmitter circuits as used in security alarm devices and garage door radio controls. Standard filtering techniques used to eliminate these harmonics are expensive compared to the total cost of the oscillator and transmitter. Therefore, what is desired is an effective and inexpensive method for suppressing radiated harmonics from such devices while maintaining oscillator frequency stability.

SUMMARY OF THE INVENTION

Accordingly the present invention provides suppression of radiated harmonics from an oscillator and transmitter circuit by introducing a narrow band filter in the feedback loop. The filter, such as a surface acoustic wave resonator (SAWR), is placed in a portion of the feedback loop which does not affect the gain of the circuit, but is at the "point of emission", or effective antenna. Specifically the filter replaces a base bypass capacitor which only serves as an a.c. path for the feedback loop. The SAWR has a first order equivalent circuit of an RLC series resonant circuit, is fabricated by cutting very shallow grooves or using very thin metallic strips in the reflective array portion of the resonator, and is operated with an input power level at less than ten dBm, resulting in suppression of the radiated harmonics.

The objects, advantages and novel features of the present invention will be apparent from the following detailed description when read in conjunction with the appended claims and attached drawing.

DESCRIPTION OF THE PREFERRED EMBODIMENT

Figure 2:
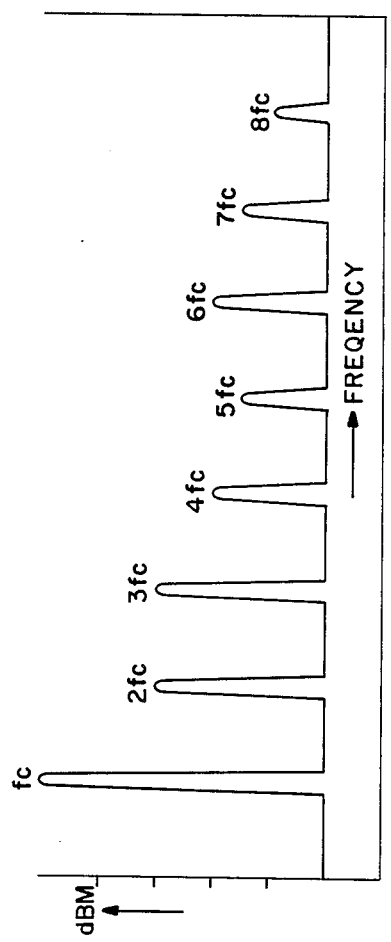
FIG. 2 is a frequency spectrum view of the emissions from the oscillator and transmitter of FIG. 1.

The problem to be solved is that of excessive harmonic emissions. By placing transmission line resonance elements from collector to ground, the "point of emission" was determined not to be the collector parallel LC resonant circuit since little or no change was observed in the harmonic levels as shown in FIG. 2. Therefore, the "point of emission" is in the feedback loop. Since the series tuned emitter establishes the gain of the transistor stage, this is not the point at which to place a harmonic radiation suppression device since the series resistance of such a device only makes the gain less and reduces the available power. Since the bypass capacitor in the base circuit is only acting as an a.c. path for the feedback loop, this is the place to substitute a narrow band filter for harmonic suppression.

Figure 3:
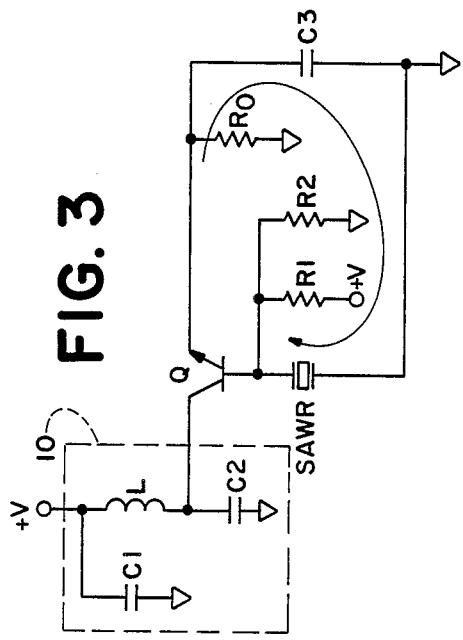
FIG. 3 is a schematic diagram view of a single stage transistor oscillator and transmitter with suppression of radiated harmonics according to the present invention.

Referring now to FIG. 3 a single stage oscillator and transmitter according to the present invention is shown. The active device is a transistor Q having a parallel LC resonant circuit 10 in the collector circuit. The LC circuit 10 is tuned to the desired frequency by the values selected for the inductor L, parallelly connected capacitor C1 and serially connected capacitor C2. The emitter circuit of the transistor Q has an output resistor Ro connected in parallel with an emitter capacitor C3. The emitter capacitor C3 together with the inherent emitter resistance and inductance forms a series resonant circuit. Base bias for the transistor Q is provided by a voltage divider network of resistors R1 and R2. Also connected between the base and the circuit voltage return bus, or signal ground, is a narrow band filter such as a surface acoustic wave resonator SAWR which forms an equivalent series RLC circuit in the base circuit.

Figure 4:
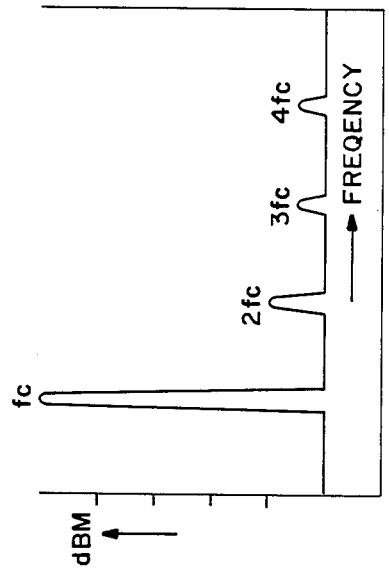
FIG. 4 is a frequency spectrum view of the emissions from the oscillator and transmitter of FIG. 3.
Figure 1:
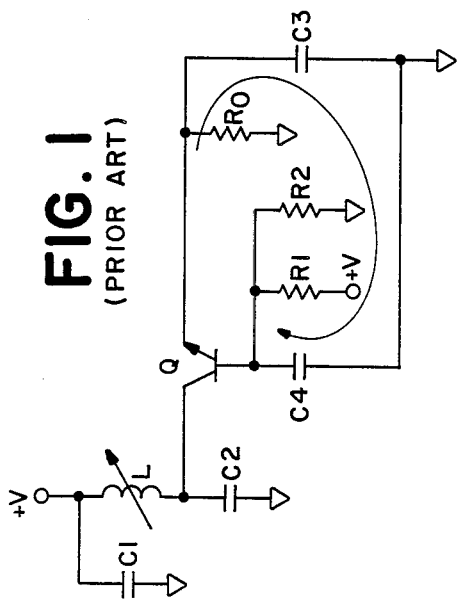
FIG. 1 is a schematic diagram view of a prior art single stage transistor oscillator and transmitter.

Although any narrow band filter with similar characteristics may be used, such as LC low pass or band pass filters, due to cost and characteristics a surface acoustic wave device is preferred. Unlike a bulk wave resonator that has intrinsic harmonic resonances which are undesirable for this application, the SAWR can be designed to be "reentrant free" at the harmonics. This characteristic is achieved by fabricating very shallow grooves or using very thin aluminum strips in the reflective array portion of the resonator and operating the input power level of the resonator at less than ten dBm. Since the "point of emission", or effective antenna, is the signal ground, the substitution of the narrow band filter for the base bypass capacitor narrows the bandwidth of the feedback loop sufficiently to limit the harmonics to an acceptable level as shown in FIG. 4. Besides the suppression of radiated harmonics, the SAWR is preferable to an LC narrow band filter of similar characteristics because of its inherent frequency stability which eliminates the need to have the collector inductor L be tunable.

Thus the present invention provides suppression of radiated harmonics in a single stage transistor oscillator and transmitter by substituting a narrow band filter in the feedback loop at the "point of emission".

What is claimed is:

1. An oscillator and transmitter circuit having suppression of radiated harmonics comprising:
   an active device having a resonant circuit which resonates at a desired frequency and having a feedback loop to maintain oscillation; and
   a narrow band filter connected in the feedback loop at the point of emission of the radiated harmonics to narrow the bandwidth of the feedback loop to suppress the harmonics.

2. An oscillator and transmitter circuit as recited in claim 1 wherein the narrow band filter comprises a surface acoustic wave resonator which resonates at the desired frequency and is reentrant free at harmonics of the desired frequency.

3. An oscillator and transmitter circuit having suppression of radiated harmonics comprising:
   a transistor having a resonant circuit which resonates at a desired frequency in the collector circuit and having a feedback loop between the emitter and base to maintain oscillation; and
   a narrow band filter connected in the feedback loop at the point of emission of the radiated harmonics to narrow the bandwith of the feedback loop to suppress the harmonics.

4. An oscillator and transmitter circuit as recited in claim 3 wherein the feedback loop comprises a series resonant circuit connected between the emitter and signal ground, the narrow band filter being connected between the base and signal ground to complete the feedback loop.

5. An oscillator and transmitter circuit as recited in claim 4 wherein the narrow band filter comprises a surface acoustic wave resonator which resonates at the desired frequency and is reentrant free at harmonics of the desired frequency.

6. An oscillator and transmitter circuit as recited in claim 4 wherein the narrow band filter comprises an LC narrow bandwidth filter which resonates at the desired frequency and rejects harmonics of the desired frequency.

* * * * *